United States Patent [19]

Brueck et al.

[11] Patent Number: 5,691,563

[45] Date of Patent: *Nov. 25, 1997

[54] SILICON METAL-SEMICONDUCTOR-METAL PHOTODETECTOR

[75] Inventors: Steven R. J. Brueck; David R. Myers; Ashwani K. Sharma, all of Albuquerque, N. Mex.

[73] Assignee: Sandia National Laboratories, Albuquerque, N. Mex.

[*] Notice: The term of this patent shall not extend beyond the expiration date of Pat. No. 5,449,945.

[21] Appl. No.: 527,304

[22] Filed: Sep. 12, 1995

Related U.S. Application Data

[63] Continuation of Ser. No. 4,803, Jan. 15, 1993, Pat. No. 5,449,945.

[51] Int. Cl.$^6$ .................................................. H01L 31/00
[52] U.S. Cl. ........................... 257/449; 257/451; 257/453; 257/617
[58] Field of Search .................................. 257/449, 451, 257/617, 453, 454, 455, 456, 457, 471

[56] References Cited

U.S. PATENT DOCUMENTS

| | | | |
|---|---|---|---|
| 4,584,026 | 4/1986 | Wu et al. | 257/607 |
| 4,689,645 | 8/1987 | Ovshinsky et al. | 257/56 |
| 4,807,006 | 2/1989 | Rogers et al. | 257/449 |
| 4,821,091 | 4/1989 | Hammond et al. | 257/617 |

FOREIGN PATENT DOCUMENTS 55-53466  4/1980  Japan ................................. 257/449

OTHER PUBLICATIONS

Mullins, B.W., et al., "A Simple High-Speed Schottky Photodiode," IEEE Photonics Technology Letters, vol. 3, No. 4, Apr. 1991, pp. 360–362.

*Primary Examiner*—Jerome Jackson
*Assistant Examiner*—John Guay
*Attorney, Agent, or Firm*—Gregory A. Cone

[57] ABSTRACT

Silicon MSM photodiodes sensitive to radiation in the visible to near infrared spectral range are produced by altering the absorption characteristics of crystalline Si by ion implantation. The implantation produces a defected region below the surface of the silicon with the highest concentration of defects at its base which acts to reduce the contribution of charge carriers formed below the defected layer. The charge carriers generated by the radiation in the upper regions of the defected layer are very quickly collected between biased Schottky barrier electrodes which form a metal-semiconductor-metal structure for the photodiode.

2 Claims, 2 Drawing Sheets

SILICON METAL-SEMICONDUCTOR-METAL PHOTODETECTOR

This is a continuation of application Ser. No. 08/004,803 filed on Jan. 15, 1993 now U.S. No. 5,449,387.

BACKGROUND OF THE INVENTION

This invention relates to silicon photodiodes. More particularly, it relates to silicon photodiodes that are compatible with standard CMOS VLSI processing techniques that are effective in the visible to near infra-red spectral range.

Si technology dominates the microelectronics marketplace. Optoelectronics, on the other hand, has been largely based on III-V semiconductors such as GaAs and InP and additional ternary and quaternary compounds grown on these materials. This is largely because of the stronger interaction (absorption and emission) with electromagnetic fields at above-bandgap energies in these direct bandgap semiconductors as compared with the weaker absorption of indirect bandgap Si over much of the near infrared and visible spectral region. Thus, III-V semiconductor lasers have been developed over a wide range of wavelengths from the red at 630 nm to the near infrared at 2 µm or even longer wavelengths. Lasers fabricated directly from Si have not yet been achieved.

The weaker absorption of Si also impacts the design and performance of optical detectors. Over much of the visible and near-IR, Si absorption lengths are on the order of 10's of micrometers. This dictates a vertical structure for Si detectors with a p-doped upper layer, a thick intrinsic layer that provides the absorption and an n-doped substrate. The roles of the n- and p- layers could also be reversed. Alternatively, low doping levels resulting in a wide depletion region for the p-n junction may be used. Two difficulties with this detector configuration are 1) the detectors are relatively slow because of the drift times across the wide intrinsic region and 2) fabrication requires deep diffusions and/or thick growths and the detectors are difficult to integrate with VLSI circuits whose active device layers are confined to very narrow regions (~1-2 µm or less) at the top of the wafer. Certainly, the necessity of accessing the substrate region in these Si detectors makes them incompatible with standard VLSI device fabrication.

Optical interconnections in high-performance computer systems are a potentially important application of optoelectronics. Traditional electrical (wire) based interconnections are approaching speed and density limitations imposed by capacitance, crosstalk, and thermal effects. Optical signals propagate at the speed-of-light, are inherently more immune to crosstalk, and potentially require lower powers. Many possible architectures are under investigation. One aspect is common, however, eventually the optical interconnect must be integrated with the Si circuitry of the computer. Most approaches today are investigating hybrid techniques in which a III-V detector is somehow coupled to the Si circuit. This requires complex and highly precise and delicate packaging and assembly and will negatively affect yield in a production environment.

Even the operating wavelength of an optical interconnection system is far from clear at this point. Almost certainly, semiconductor-diode-based optical sources will be used; inevitably, this will be true for any volume application as the optical interconnect technology penetrates beyond the very high-end systems. As mentioned above, this constrains the wavelength to the range 0.6-2 µm. Within this range several wavelengths offer significant advantages: ~860 nm (wavelength range of GaAs/GaAlAs lasers, among the best developed and highest power sources), and 1.3 and 1.55 µm (wavelengths of long distance fiber communication systems).

There are also advantages in terms of diode laser lifetime in working at a number of other wavelengths such as 800 nm or 980 nm.

This background points to the need for improved Si detector performance, fully compatible with VLSI technology.

SUMMARY OF THE INVENTION

Si based metal-semiconductor-metal (MSM) detectors have been investigated previously as high speed detectors and heterodyne photomixers in the near ultraviolet (334 nm) region of the spectrum. This disclosure is "A Simple High-Speed Si Schottky Photo diode" by B. W. Mullins, S. F. Soares, K. A. McArdle, C. M. Wilson, and S. R. J. Brueck in IEEE Photonics Technology Letters, Vol. 3, No. 4, April 1991, pp. 360-362. This disclosure is incorporated herein by reference. The major result of this study was that in this near-ultraviolet wavelength regime, where the absorption coefficient of Si is very high, these MSM detectors were very effective. The speed of these MSM detectors is largely set by the saturation drift velocity of the slower carriers (holes) which is of the order $1 \times 10^7$ cm/s for both Si and GaAs. Further, the relative robustness of the Si—$SiO_2$ interface made these detectors much more applicable in a heterodyne environment with a substantial ultraviolet local-oscillator irradiation intensity than were similar GaAs-based devices. The fabrication process for these detectors was a very simple, three-mask-step sequence that is fully compatible with present VLSI technology. Detector response speeds achieved were ~24 Ghz for a 4.5-µm gap with a calculated response of 86 GHz for a 1-µm gap device, where the gap is the distance between the metal electrodes.

When operated in the long wavelength regime of interest for optical interconnections, however, the performance of these detectors was severely compromised. Because of the long absorption lengths at these wavelengths, electron-hole pairs were created well into the bulk of the Si where the fields applied at the surface were much reduced. The photogenerated carriers diffuse and recombine in the bulk of the Si, with only a fraction diffusing into the high field region and being collected at the electrodes. The result is a reduced speed due to the relatively slow diffusion process and a lowered quantum efficiency because of the carriers that recombine without any electrode current.

With this background, it is clear that the low absorption of crystalline Si in the near-infrared wavelength range prevents the successful extension of this very simple, and fully VLSI compatible, MSM detector configuration. The invention disclosed here is the use of ion-implantation to establish a heavily defected region below the surface of the Si wafer. Under appropriate implantation conditions, the major part of the radiation damage occurs near the end of the ion range while leaving comparatively high-quality material near the surface. Carriers generated in the defected region will drift to the electrodes at high velocity because of the strong fields and result in an enhanced photocurrent. Most of the transport occurs in the less defected portion of the Si layer nearest the surface where the transport properties are unaffected by the ion-implantation. Further, the disruption of crystallinity in the deeper portions of the defected region increases the local resistivity and provides recombination centers for nonequilibrium carriers reducing the contribution of carriers generated by absorption in the undisturbed material below the implant range. This enhances the speed of the device at some sacrifice in responsivity. A sacrifice more than made up by the increased absorption in the defected region as demonstrated by the results below.

DETAILED DESCRIPTION OF THE INVENTION

Figure 1:
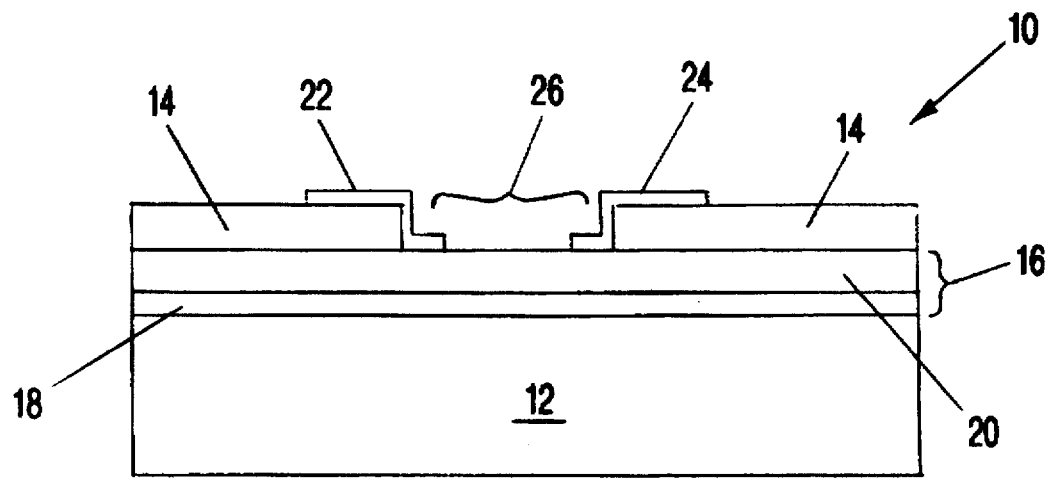
FIG. 1 is a cross section view of the Si photodiode of this invention in which the ion-implanted layer is formed prior to the opening of the window in the silicon dioxide layer.

FIG. 1 is a cross sectional view of the specific embodiment discussed herein. Plan views of the detector configuration are not shown. The Si photodiode 10 starts with a Si substrate 12 which has an ion-implanted layer 16. The implanted layer has a deep section 18 which contains a higher concentration of defects and a shallow region 20 which is relatively undamaged by the implantation. The silicon dioxide layer 14 contains a window over the edges of which are found Schottky barrier electrodes 22 and 24 which extend down onto the surface of the Si. The gap 26 represents the area of the photodiode through which the great majority of the radiation enters and thereafter interacts with the Si to generate carriers. These carriers are collected at the electrodes. The electrodes are further connected to other circuit elements not shown which provide bias across the electrodes to fully deplete the Si region below the gap 26 and also to measure the amount of the collected carriers in an appropriate manner.

Figure 2:
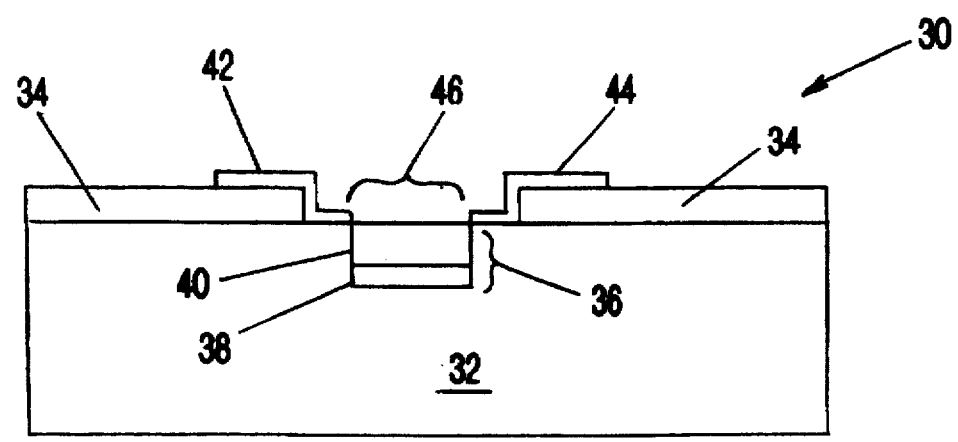
FIG. 2 is a cross section view of the Si photodiode of this invention in which the ion-implanted layer is formed after the deposition of the electrodes.

FIG. 2 represents an alternative device that differs from the device of FIG. 1 in that the ion implantation is done after the deposition of the electrodes 42 and 44. This creates a self-aligned ion-implanted region 36 which has a deeper portion 38 with the majority of the defects and a shallower portion 40 that is relatively undamaged. The gap 46 is the area between the electrodes where the majority of the radiation enters into the Si for interaction and generation of carriers. The Si substrate 32 and the oxide layer 34 are similar to the corresponding elements in FIG. 1.

MSM detectors are generally fabricated with an interdigitated electrode structure that increases the active area while still retaining short drift regions to enhance the speed. Several other related designs are also possible. In this design, the ion implant is carried out before the fabrication of the electrodes, resulting in a blanket, or uniform, ion-implanted layer. For the results presented here, the ion-dose, energy and substrate temperature were chosen to produce significantly enhanced sub-bandgap optical absorption.

Guidance is found in an article by U. Zammit, F. Gasparrini, M. Marinelli, R. Pizzoferrato, A. Agostini, and F. Mercuri, "Ion Dose Effect in Subgap Absorption Spectra of Defects in Ion-Implanted GaAs and Si," Jour. Appl. Phys. 70, 7060–7064, 1991. This disclosure is incorporated by reference. A specific ion-implantation protocol explored in our initial investigation included multiple fluorine (mass 19) implants to a maximum energy of 280 keV at affluence of $1 \times 10^{15}$ cm$^{-2}$. Implant simulation codes (the PRAL algorithm distributed by IBM) suggest that the first implant protocol produces a defected layer extending to approximately down to about 0.66 µm from the surface, while the second protocol produces a defected layer 0.89 µm from the surface (taking the damage depth as range plus twice the straggle).

The MSM photodiode was fabricated with Ni Schottky contacts on bulk Si (n~$8 \times 10^{14}$ cm$^{-3}$, p-doped Si could be used in other applications). A planar, lateral geometry with both contacts on the top surface of the Si was used. After the Si wafers were cleaned, they were ion implanted as described above. (It should be noted that this structure could be formed in polycrystalline Si deposited on other substrates). This ion implant can also be done after the electrodes are formed in a self aligned process resulting in the structure seen in FIG. 2. After the implant, the oxide layer was grown by inserting the implanted wafer into a pre-heated furnace (1100° C.) in an $O_2$ flow of 4 l/min to grow an oxide layer of about 100 nm. Windows in the oxide layer were then etched, and the metal films forming the electrodes were deposited in two photolithographic steps. The metal films were deposited using an electron-beam evaporator at a rate of about 0.5 nm/s. For the initial devices we have used a Ni—Cr—Au metalization. The Ni—Si interface layer provides the Schottky barrier, the Cr is a binding layer and the Au provides a thick metalization for further bonding purposes. Other noble metals such as Pt could be substituted for the Au. The total metalization is approximately 300-nm thick. For these implant conditions, high quality Schottky barriers are formed at the Ni:Si interface. Other, more aggressive implant parameters resulted in poor, high-leakage, Schottky barriers. This indicates that a substantial art is required in selection of implant characteristics to optimize detector performance.

To reduce the impact of the implantation on the Schottky barrier characteristics, an alternative processing scheme such as shown in FIG. 2 can be used. For this embodiment, the detector is fabricated before implantation and the metalization layers serve as a self-aligned implant mask. This approach has the benefit that the Si surface layer forming the Schottky barrier is never exposed to the implantation process. Care should be taken to prevent ion implant damage to the Si underlying the immediate edges of the electrode to avoid leakage current. An additional mask above the electrode may be used to move the edge of the implant inward of the electrodes.

Figure 3:
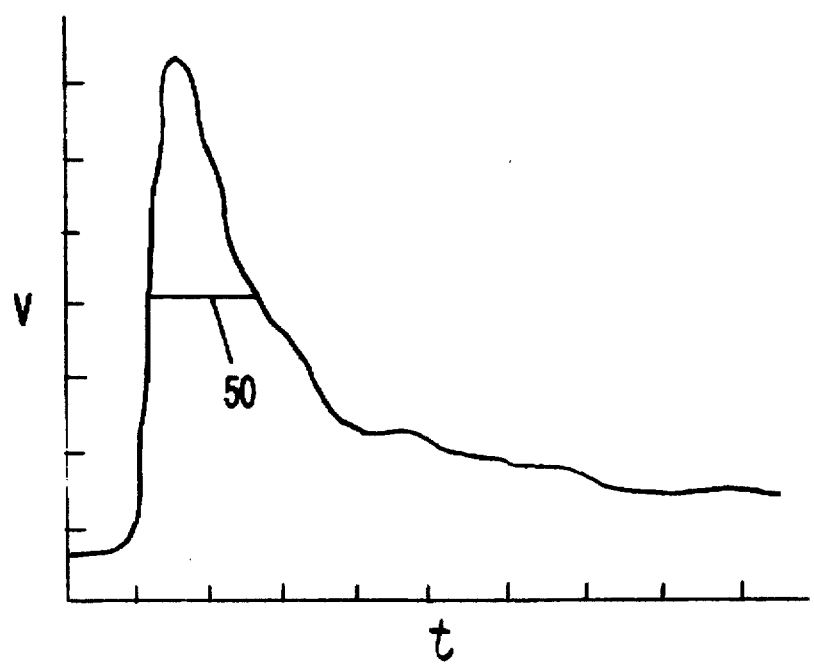
FIG. 3 is a graph of the response of the ion-implanted Si photodetector of this invention to an impulse of light at a wavelength of 760 nm.
Figure 4:
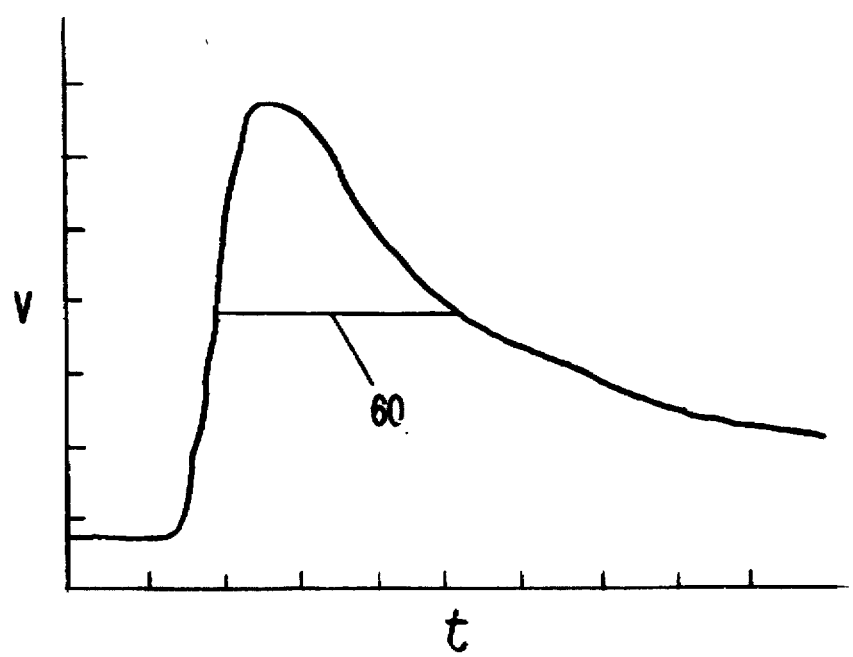
FIG. 4 is a graph of the response of an identically fabricated Si photodetector without the ion implantation at a wavelength of 760 nm.

FIG. 3 shows the impulse response on time scales of 100 ps/div for the ion-implanted-Si detector of FIG. 1 for ~150-fs duration input pulses at a wavelength of 760 nm. Note the fast response time and the complete recovery on a time scale of ~2 ns at an electrode bias voltage of 5 volts. In contrast, the response of a crystal-Si detector, identically fabricated at the same time, is shown in FIG. 4. There is a much more pronounced long time response (~300 ps. vs. ~100 ps as noted by the half maximum widths 50 and 60 in FIGS. 3 and 4). The crystal Si detector was under a higher bias (10 volts) which should have led to a faster response. The initial fall time response of the first major pulse is probably not a good measure of the response time since these times are affected by the detector packaging as well as the intrinsic detector response. However, the absence of a long-time response in the ion-implanted-Si detector is a clear device enhancement.

The low frequency response at a wavelength of 870 nm for the detectors of FIGS. 3 and 4 was determined for a cw-modelocked pulse train at 100 MHz, using a low frequency amplifier, to provide a measure of the integrated signal or equivalently, the quantum efficiency. For these measurements, the optical beam area was much larger than the detector dimensions to ensure a uniform filling of the aperture. The peak-to-peak response under identical irradiation and bias conditions is 35 mV for the crystal-Si detector and 90 mV for the ion-implanted-Si detector. Thus, the effect of the implant, which is the only difference between the two detectors has been to improve both the temporal response and the responsivity. Further improvements are likely as this fabrication sequence is optimized.

Previous workers have shown that the absorption for ion-implanted, defected Si is much larger than that for crystal Si over much of the visible and near infrared wavelength regions. In particular, Wesch and Götz, Department of Physics, University of Jena, ["Influence of Ion Implantation on the Optical Properties of Silicon"] have shown that the absorption at 1.2 μm saturates at a value of ~4000 cm$^{-1}$ near the amorphization dose. They attribute the increased absorption to the formation of point defects in the vicinity of the amorphous clusters formed during implantation. In addition to the absorption increase, there is also an increase in the refractive index, this will reflect some portion of the incident radiation back towards the surface and further increase the responsivity. Similarly, Zammit et. al. [U. Zammit, F. Gasparrini, M. Marinelli, R. Pizzoferrato, A. Agostini, and F. Mercuri, "Ion dose effect in subgap absorption spectra of defects in ion implanted GaAs and Si," Journal of Applied Physics, V.70, No.11, pp.7060–7064, 1 Dec. 1991] have shown a spectrally broad absorption in the sub-bandgap region for ion-implant damaged Si, independent of implant species, and extending across all of the wavelengths presently of interest for communications applications. Additionally, Boussey-Said et. al. [J. Boussey-Said, G. Ghibaudo, I. Stoemenos and P. Zaumseil, "Electrical and Structural Properties of Silicon Layers Heavily Damaged by Ion Implantation," J. Appl. Phys. 72, 61–68 (1992)] have shown that the structural modifications such as point defects induced in the Si by ion implantation are, to some extent, independent of the implant chemical species. These three articles are incorporated by reference. Again, this points to the art required for optimization of this detector fabrication process.

In summary, we have disclosed an invention that applies the ion-bombardment-induced alteration of the optical and electrical properties of Si to produce enhanced high-speed MSM photodetectors fabricated using widely available ion-implantation and Si processing technologies. Importantly, the device design, as well as the processing, is fully compatible with integration with Si microelectronics. These detectors exhibit improved sensitivity over otherwise identical, unimplanted Si detectors at wavelengths commonly used for fiber-based local area networks (0.87 μm).

We disclose several approaches to realization of these devices. The favorable alteration of the properties of silicon by the implantations appear not to be specific to ion species, to implant energy, nor to sample temperature during implantation, but rather to require the creation of an appropriate number of defects within the implanted region. Zammit et. al. teach that the enhancement in performance that we have verified for 0.87- and 1.15-μm wavelengths will also hold for 1.3 and 1.55 μm wavelengths of importance for long-haul telecommunications applications as well as local-area networks. The devices resulting from this invention hold great promise for the integration of optical communications systems with the silicon microelectronics technology underlying modern computers and information processing systems.

We claim:

1. A silicon-based photodiode having effective response to radiation in the visible to near infrared wavelengths comprising:

a planar layer comprising crystalline Si having a defected layer within it produced by ion implantation extending into the Si layer below the surface of the Si layer exposed to the radiation wherein the defected layer has its highest concentration of defects in its deepest portion such that a region of relatively higher resistivity and containing a greater number of recombination centers is formed therein sufficient to reduce the collection at the electrodes of charge carriers produced below the defected layer;

at least two Schottky barrier electrodes on the Si layer adjacent the defected layer;

and means to sense the photodiode response to the radiation, said means being connected between the at least two electrodes.

2. A silicon-based metal-semiconductor-metal photodiode having effective response to radiation in the visible to near infrared wavelengths comprising:

a planar layer comprising crystalline Si having a defected layer within it produced by ion implantation extending into the Si layer down to about 1.0 μm below the surface of the Si layer exposed to the radiation wherein the defected layer has its highest concentration of defects in its deepest portion such that a region of relatively higher resistivity and containing a greater number of recombination centers is formed therein sufficient to reduce the collection at the electrodes of charge carriers produced below the defected layer;

two interdigitated Schottky barrier electrodes on the Si layer adjacent the defected layer;

and means to sense the photodiode response to the radiation, said means being connected between the at least two electrodes.

* * * * *